(12) United States Patent
Adar et al.

(10) Patent No.: US 6,901,550 B2
(45) Date of Patent: May 31, 2005

(54) TWO-DIMENSIONAL INTERLEAVING IN A MODEM POOL ENVIRONMENT

(75) Inventors: Ilan Adar, Petach Tikva (IL); Ishai Ilani, Modiin (IL); Ofer Sharon, Rishon Le Zion (IL)

(73) Assignee: Actelis Networks Inc., Fremont, CA (US)

( * ) Notice: Subject to any disclaimer, the term of this patent is extended or adjusted under 35 U.S.C. 154(b) by 388 days.

(21) Appl. No.: 09/978,165

(22) Filed: Oct. 17, 2001

(65) Prior Publication Data

US 2003/0074625 A1 Apr. 17, 2003

(51) Int. Cl.$^7$ .................. H03M 13/00; H03M 13/03; G06F 11/00; G11C 29/00
(52) U.S. Cl. .................. 714/762; 714/788; 714/761; 714/701; 714/702; 714/787
(58) Field of Search .................. 714/701, 702, 714/761, 762, 776, 787, 788

(56) References Cited

U.S. PATENT DOCUMENTS

| | | | |
|---|---|---|---|
| 5,056,105 A | | 10/1991 | Darmon et al. |
| 5,191,576 A | * | 3/1993 | Pommier et al. ............ 370/312 |
| 5,299,208 A | | 3/1994 | Blaum et al. |
| 5,400,305 A | * | 3/1995 | Sadanaka ..................... 369/2 |
| 5,483,541 A | | 1/1996 | Linsky |
| 5,572,548 A | * | 11/1996 | Pirez et al. .................. 375/260 |
| 5,636,224 A | * | 6/1997 | Voith et al. .................. 714/701 |
| 5,799,033 A | | 8/1998 | Baggen |
| 5,898,710 A | | 4/1999 | Amrany |
| 5,968,200 A | | 10/1999 | Amrany |
| 5,983,174 A | * | 11/1999 | Wong et al. ................ 704/228 |
| 5,983,388 A | * | 11/1999 | Friedman et al. ............ 714/776 |
| 6,065,149 A | * | 5/2000 | Yamanaka .................... 714/780 |
| 6,366,776 B1 | * | 4/2002 | Wright et al. ............... 455/427 |
| 6,424,637 B1 | * | 7/2002 | Pecen et al. ................ 370/328 |
| 6,598,198 B1 | * | 7/2003 | Furuta et al. ............... 714/763 |

OTHER PUBLICATIONS

McCourt, P. M.; Kaouri, H. A.; Transform coding at 4.8 kbit/sec using interleaving of transform frames and dual gain–shape vector quantization, IEEE International Conference on Acoustics, Speech, and Signal Processing, vol.: 2 Apr. 27–30, 1993, pp.: 624.*
U.S. Appl. No. 09/510,552, filed Feb. 22, 2000, Barlev et al.

\* cited by examiner

Primary Examiner—Guy J. Lamarre
Assistant Examiner—Joseph D. Torres
(74) Attorney, Agent, or Firm—Eitan, Pearl, Latzer & Cohen Zedek, L.L.P.

(57) ABSTRACT

A method for interleaving data frames transmitted via a modem pool, each of the data frames including a plurality of codewords having a predefined level of error correction, including assigning the data frames to corresponding modem timeframes, where codeword symbols in each of the data frames are assigned to time slots in the modems in the corresponding timeframes such that the level of error correction is sufficient to correct error/loss caused to any of the symbols given a predefined level of modem loss/malfunction, and moving any of the codeword symbols assigned to one of the timeframes to another of the timeframes such that the level of error correction is sufficient to correct error/loss caused to any of the symbols given a predefined level of cross-modem error burst while preserving the level of error correction sufficient to correct error/loss caused to any of the symbols given the level of modem loss/malfunction.

57 Claims, 9 Drawing Sheets

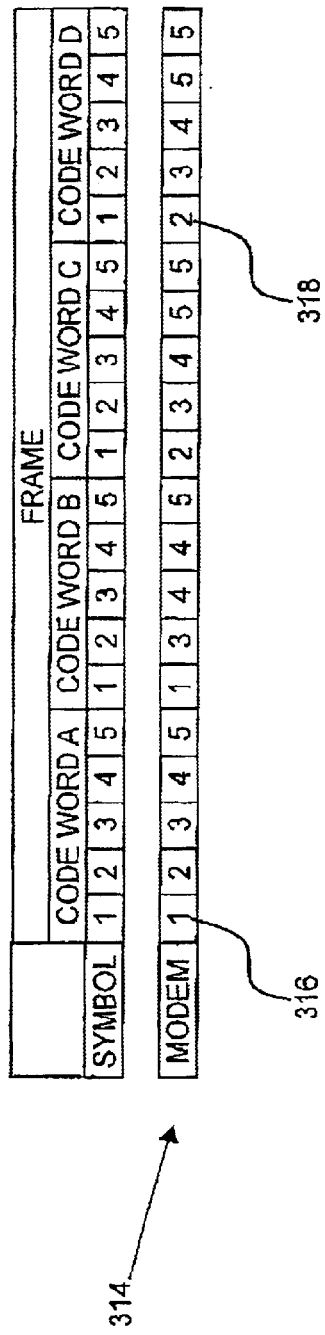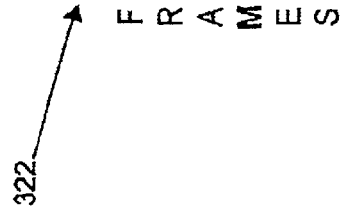

Fig. 3H (322′, 324)

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| | 81 | 62 | 43 | 24 | 5 | 86 | 67 | 48 | 29 | 10 | 91 | 72 | 53 | 34 | 15 | 96 | 77 | 58 | 39 | 20 |
| | 1 | 82 | 63 | 44 | 25 | 6 | 87 | 68 | 49 | 30 | 11 | 92 | 73 | 54 | 35 | 16 | 97 | 78 | 59 | 40 |
| | 21 | 2 | 83 | 64 | 45 | 26 | 7 | 88 | 69 | 50 | 31 | 12 | 93 | 74 | 55 | 36 | 17 | 98 | 79 | 60 |
| | 41 | 22 | 3 | 84 | 65 | 46 | 27 | 8 | 89 | 70 | 51 | 32 | 13 | 94 | 75 | 56 | 37 | 18 | 99 | 80 |
| | 61 | 42 | 23 | 4 | 85 | 66 | 47 | 28 | 9 | 90 | 71 | 52 | 33 | 14 | 95 | 76 | 57 | 38 | 19 | 100 |

Fig. 3I (322″, 324)

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| | 1 | 22 | 43 | 64 | 85 | 6 | 27 | 48 | 69 | 90 | 11 | 32 | 53 | 74 | 95 | 16 | 37 | 58 | 79 | 100 |
| | 81 | 2 | 23 | 44 | 65 | 86 | 7 | 28 | 49 | 70 | 91 | 12 | 33 | 54 | 75 | 96 | 17 | 38 | 59 | 80 |
| | 61 | 82 | 3 | 24 | 45 | 66 | 87 | 8 | 29 | 50 | 71 | 92 | 13 | 34 | 55 | 76 | 97 | 18 | 39 | 60 |
| | 41 | 62 | 83 | 4 | 25 | 46 | 67 | 88 | 9 | 30 | 51 | 72 | 93 | 14 | 35 | 56 | 77 | 98 | 19 | 40 |
| | 21 | 42 | 63 | 84 | 5 | 26 | 47 | 68 | 89 | 10 | 31 | 52 | 73 | 94 | 15 | 36 | 57 | 78 | 99 | 20 |

Fig. 3J (322‴, 324)

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| | 41 | 2 | 63 | 24 | 85 | 46 | 7 | 68 | 29 | 90 | 51 | 12 | 73 | 34 | 95 | 56 | 17 | 78 | 39 | 100 |
| | 61 | 22 | 83 | 44 | 5 | 66 | 27 | 88 | 49 | 10 | 71 | 32 | 93 | 54 | 15 | 76 | 37 | 98 | 59 | 20 |
| | 81 | 42 | 3 | 64 | 25 | 86 | 47 | 8 | 69 | 30 | 91 | 52 | 13 | 74 | 35 | 96 | 57 | 18 | 79 | 40 |
| | 1 | 62 | 23 | 4 | 45 | 6 | 67 | 28 | 89 | 50 | 11 | 72 | 33 | 94 | 55 | 16 | 77 | 38 | 99 | 60 |
| | 21 | 82 | 43 | 84 | 65 | 26 | 87 | 48 | 9 | 70 | 31 | 92 | 53 | 14 | 75 | 36 | 97 | 58 | 19 | 80 |

| INDEX | CODE WORD | FRAME | MODEM |
|---|---|---|---|
| 1 | A1 | 1 | 1 |
| 22 | A2 | 2 | 2 |
| 43 | A3 | 3 | 3 |
| 64 | A4 | 4 | 4 |
| 85 | A5 | 5 | 5 |
| 6 | B1 | 1 | 1 |
| 27 | B2 | 2 | 3 |
| 48 | B3 | 3 | 4 |
| 69 | B4 | 4 | 4 |
| 90 | B5 | 5 | 5 |
| 11 | C1 | 1 | 2 |
| 32 | C2 | 2 | 3 |
| 53 | C3 | 3 | 4 |
| 74 | C4 | 4 | 5 |
| 95 | C5 | 5 | 5 |
| 16 | D1 | 1 | 2 |
| 37 | D2 | 2 | 3 |
| 58 | D3 | 3 | 4 |
| 79 | D4 | 4 | 5 |
| 100 | D5 | 5 | 5 |

Fig. 4B

TWO-DIMENSIONAL INTERLEAVING IN A MODEM POOL ENVIRONMENT

FIELD OF THE INVENTION

The present invention relates to modem communications in general, and more particularly to interleaving in a modem pool environment.

BACKGROUND OF THE INVENTION

The use of Forward Error Correction (FEC) techniques in the design of digital communications and storage systems is well known. FEC is used to find and correct limited errors caused by a transport or storage system in order to ensure the validity of the received message without requiring retransmissions. Some conventional FEC encoding techniques provide data redundancy by adding extra code symbols to a transmitted message which provide the necessary detection and correction information. The number of redundant symbols is determined by the amount and type of error correction required. In general, r redundant symbols per code word are required to detect and correct up to r/2 incorrect symbols.

Since for any given FEC encoder and decoder the number of correctable errors is limited, the introduction of error bursts may cause the number of errors in a code word to be so great so as to be uncorrectable. To prevent such error bursts from causing decoder failure, interleaving techniques may be used to spread the transmission of each code word over a greater time frame such that an error burst will cause a correctable number of errors per code word.

In an environment where a data stream is split up and transmitted via multiple modems in a modem pool to another modem pool, transmitting each code word in a frame via a different modem risks unrecoverable loss of data in the event of a failure of one or more modems even if conventional interleaving techniques are used. Furthermore, error bursts may affect multiple modems at the same time, also resulting in unrecoverable data loss. Interleaving techniques that address both modem failure and cross-modem error bursts in a modem pool environment would therefore be advantageous.

SUMMARY OF THE INVENTION

The present invention seeks to provide interleaving techniques that address both modem failure and cross-modem error bursts in a modem pool environment that overcomes disadvantages and limitations of the prior art.

In one aspect of the present invention a method is provided for interleaving a plurality of data frames for transmission via a plurality of modems in a modem pool, where each of the data frames includes a plurality of code words having a predefined level of error correction, the method including assigning the plurality of data frames to a corresponding plurality of modem time frames, where a plurality of code word symbols in each of the data frames is assigned to a plurality of time slots in the modems in the corresponding time frames such that the predefined level of error correction is sufficient to correct error or loss caused to any of the symbols given a predefined level of modem loss or malfunction, and moving any of the code word symbols assigned to one of the time frames to another of the time frames such that the predefined level of error correction is sufficient to correct error or loss caused to any of the symbols given a predefined level of cross-modem error burst while preserving the predefined level of error correction sufficient to correct error or loss caused to any of the symbols given the predefined level of modem loss or malfunction.

In another aspect of the present invention the assigning step includes assigning such that each of the modems is assigned symbols from a plurality of code words.

In another aspect of the present invention the assigning step includes assigning such that the code word symbols are divided as evenly as possible among the modems.

In another aspect of the present invention the assigning step includes assigning where the plurality of data frames number at least X/Y, where X is the maximum number of expected errors in a code word given either of the predefined level of modem loss and the predefined level of cross-modem error burst, and Y is the maximum number of symbols that may be corrected in any given code word given the predefined level of error correction.

In another aspect of the present invention X is the maximum number of expected errors in a code word if interleaving is not employed.

In another aspect of the present invention the moving step includes moving any of the code word symbols assigned to a modem time slot in one of the time frames to the same modem time slot in another of the time frames.

In another aspect of the present invention the moving step includes moving such that each of the time frames includes code word symbols from a plurality of the data frames.

In another aspect of the present invention the moving step includes moving such that the code word symbols are divided as evenly as possible among the time frames.

In another aspect of the present invention the method further includes deriving a modem assignment vector for each of the data frames corresponding to the assignment of the code word symbols to the modems in any of the time frames, and transmitting via the plurality of modems in the modem pool the code word symbols corresponding to the modem assignment vector in each of the time frames.

In another aspect of the present invention a method is provided for interleaving a plurality of data frames for transmission via a plurality of modems in a modem pool, where each of the data frames includes a plurality of code words having a predefined level of error correction, the method including assigning the plurality of data frames to a corresponding plurality of modem time frames, where a plurality of code word symbols in each of the data frames is assigned to a plurality of time slots in the modems in the corresponding time frames such that the predefined level of error correction is sufficient to correct error or loss caused to any of the symbols given a predefined level of modem loss or malfunction, constructing a matrix having a plurality of rows and columns, each row including a different one of the data frames and each column corresponding to one of the modems via which the code word symbols in the column are assigned, and changing the order of the code word symbols in any of the columns of the matrix such that the predefined level of error correction is sufficient to correct error or loss caused to any of the symbols given a predefined level of cross-modem error burst while preserving the predefined level of error correction sufficient to correct error or loss caused to any of the symbols given the predefined level of modem loss or malfunction.

In another aspect of the present invention the assigning step includes assigning such that each of the modems is assigned symbols from a plurality of code words.

In another aspect of the present invention the assigning step includes assigning such that the code word symbols are divided as evenly as possible among the modems.

In another aspect of the present invention the assigning step includes assigning where the plurality of data frames number at least X/Y, where X is the maximum number of expected errors in a code word given either of the predefined level of modem loss and the predefined level of cross-modem error burst, and Y is the maximum number of symbols that may be corrected in any given code word given the predefined level of error correction.

In another aspect of the present invention X is the maximum number of expected errors in a code word if interleaving is not employed.

In another aspect of the present invention the changing step includes rotating each column in the matrix downward by $C_N$ modulo F rows, where $C_N$ is the column number of the column, F is the number of rows in the matrix, and column elements that are rotated past the bottom of the matrix are rotated to the top of the column.

In another aspect of the present invention the changing step includes inversely ordering the columns prior to the rotating.

In another aspect of the present invention the changing step includes rotating each column element in the matrix downward by $(A+B*C_N)$ modulo F rows, where F is the number of rows in the matrix, A is a predetermined integer, B is a predetermined integer which is coprime to F, $C_N$ is the column number of the column, and column elements that are rotated past the bottom of the matrix are rotated to the top of the column, In another aspect of the present invention the changing step includes rotating such that a column element in the column $C_N$ and row R is moved to row $(R+A+B*C_N)$ modulo F.

In another aspect of the present invention the method further includes deriving a modem assignment vector for each of the data frames corresponding to the assignment of the code word symbols to the modems in any of the rows, and transmitting via the plurality of modems in the modem pool the code word symbols corresponding to the modem assignment vector in each of the rows.

In another aspect of the present invention a system is provided for interleaving a plurality of data frames for transmission via a plurality of modems in a modem pool, where each of the data frames includes a plurality of code words having a predefined level of error correction, the system including a coder operative to encode a data stream into the plurality of code words, and an interleaver operative to assign the plurality of data frames to a corresponding plurality of modem time frames, where a plurality of code word symbols in each of the data frames is assigned to a plurality of time slots in the modems in the corresponding time frames such that the predefined level of error correction is sufficient to correct error or loss caused to any of the symbols given a predefined level of modem loss or malfunction, and move any of the code word symbols assigned to one of the time frames to another of the time frames such that the predefined level of error correction is sufficient to correct error or loss caused to any of the symbols given a predefined level of cross-modem error burst while preserving the predefined level of error correction sufficient to correct error or loss caused to any of the symbols given the predefined level of modem loss or malfunction.

In another aspect of the present invention the interleaver is operative to assign such that each of the modems is assigned symbols from a plurality of code words.

In another aspect of the present invention the interleaver is operative to assign such that the code word symbols are divided as evenly as possible among the modems.

In another aspect of the present invention the interleaver is operative to assign where the plurality of data frames number at least X/Y, where X is the maximum number of expected errors in a code word given either of the predefined level of modem loss and the predefined level of cross-modem error burst, and Y is the maximum number of symbols that may be corrected in any given code word given the predefined level of error correction.

In another aspect of the present invention X is the maximum number of expected errors in a code word if interleaving is not employed.

In another aspect of the present invention the interleaver is operative to move any of the code word symbols assigned to a modem time slot in one of the time frames to the same modem time slot in another of the time frames.

In another aspect of the present invention the interleaver is operative to move such that each of the time frames includes code word symbols from a plurality of the data frames.

In another aspect of the present invention the interleaver is operative to move such that the code word symbols are divided as evenly as possible among the time frames.

In another aspect of the present invention the system further includes a demultiplexor operative to derive a modem assignment vector for each of the data frames corresponding to the assignment of the code word symbols to the modems in any of the time frames, and transmit via the plurality of modems in the modem pool the code word symbols corresponding to the modem assignment vector in each of the time frames.

In another aspect of the present invention a system is provided for interleaving a plurality of data frames for transmission via a plurality of modems in a modem pool, where each of the data frames includes a plurality of code words having a predefined level of error correction, the system including a coder operative to encode a data stream into the plurality of code words, and an interleaver operative to assign the plurality of data frames to a corresponding plurality of modem time frames, where a plurality of code word symbols in each of the data frames is assigned to a plurality of time slots in the modems in the corresponding time frames such that the predefined level of error correction is sufficient to correct error or loss caused to any of the symbols given a predefined level of modem loss or malfunction, construct a matrix having a plurality of rows and columns, each row including a different one of the data frames and each column corresponding to one of the modems via which the code word symbols in the column are assigned, and change the order of the code word symbols in any of the columns of the matrix such that the predefined level of error correction is sufficient to correct error or loss caused to any of the symbols given a predefined level of cross-modem error burst while preserving the predefined level of error correction sufficient to correct error or loss caused to any of the symbols given the predefined level of modem loss or malfunction.

In another aspect of the present invention the interleaver is operative to assign such that each of the modems is assigned symbols from a plurality of code words.

In another aspect of the present invention the interleaver is operative to assign such that the code word symbols are divided as evenly as possible among the modems.

In another aspect of the present invention the interleaver is operative to assign where the plurality of data frames number at least X/Y, where X is the maximum number of expected errors in a code word given either of the predefined level of modem loss and the predefined level of cross-modem error burst, and Y is the maximum number of symbols that may be corrected in any given code word given the predefined level of error correction.

In another aspect of the present invention X is the maximum number of expected errors in a code word if interleaving is not employed.

In another aspect of the present invention the interleaver is operative to rotate each column in the matrix downward by $C_N$ modulo F rows, where $C_N$ is the column number of the column, F is the number of rows in the matrix, and column elements that are rotated past the bottom of the matrix are rotated to the top of the column.

In another aspect of the present invention the interleaver is operative to inversely order the columns prior to the rotating.

In another aspect of the present invention the interleaver is operative to rotate each column element in the matrix downward by $(A+B*C_N)$ modulo F rows, where F is the number of rows in the matrix, A is a predetermined integer, B is a predetermined integer which is coprime to F, $C_N$ is the column number of the column, and column elements that are rotated past the bottom of the matrix are rotated to the top of the column.

In another aspect of the present invention the interleaver is operative to rotate such that a column element in the column $C_N$ and row R is moved to row $(R+A+B*C_N)$ modulo F.

In another aspect of the present invention the system further includes a demultiplexor operative to derive a modem assignment vector for each of the data frames corresponding to the assignment of the code word symbols to the modems in any of the rows, and transmit via the plurality of modems in the modem pool the code word symbols corresponding to the modem assignment vector in each of the rows.

In another aspect of the present invention in a system including a plurality of data frames for transmission via a plurality of modems in a modem pool, where each of the data frames includes a plurality of code words having a predefined level of error correction, interleaving apparatus is provided including means for assigning the plurality of data frames to a corresponding plurality of modem time frames, where a plurality of code word symbols in each of the data frames is assigned to a plurality of time slots in the modems in the corresponding time frames such that the predefined level of error correction is sufficient to correct error or loss caused to any of the symbols given a predefined level of modem loss or malfunction, and means for moving any of the code word symbols assigned to one of the time frames to another of the time frames such that the predefined level of error correction is sufficient to correct error or loss caused to any of the symbols given a predefined level of cross-modem error burst while preserving the predefined level of error correction sufficient to correct error or loss caused to any of the symbols given the predefined level of modem loss or malfunction.

In another aspect of the present invention the means for assigning is operative to assign such that each of the modems is assigned symbols from a plurality of code words.

In another aspect of the present invention the means for assigning is operative to assign such that the code word symbols are divided as evenly as possible among the modems.

In another aspect of the present invention the means for assigning is operative to assign where the plurality of data frames number at least X/Y, where X is the maximum number of expected errors in a code word given either of the predefined level of modem loss and the predefined level of cross-modem error burst, and Y is the maximum number of symbols that may be corrected in any given code word given the predefined level of error correction.

In another aspect of the present invention X is the maximum number of expected errors in a code word if interleaving is not employed.

In another aspect of the present invention the means for moving is operative to move any of the code word symbols assigned to a modem time slot in one of the time frames to the same modem time slot in another of the time frames.

In another aspect of the present invention the means for moving is operative to move such that each of the time frames includes code word symbols from a plurality of the data frames.

In another aspect of the present invention the means for moving is operative to move such that the code word symbols are divided as evenly as possible among the time frames.

In another aspect of the present invention the apparatus further includes means for deriving a modem assignment vector for each of the data frames corresponding to the assignment of the code word symbols to the modems in any of the time frames, and means for transmitting via the plurality of modems in the modem pool the code word symbols corresponding to the modem assignment vector in each of the time frames.

In another aspect of the present invention in a system including a plurality of data frames for transmission via a plurality of modems in a modem pool, where each of the data frames includes a plurality of code words having a predefined level of error correction, interleaving apparatus is provided including means for assigning the plurality of data frames to a corresponding plurality of modem time frames, where a plurality of code word symbols in each of the data frames is assigned to a plurality of time slots in the modems in the corresponding time frames such that the predefined level of error correction is sufficient to correct error or loss caused to any of the symbols given a predefined level of modem loss or malfunction, means for constructing a matrix having a plurality of rows and columns, each row including a different one of the data frames and each column corresponding to one of the modems via which the code word symbols in the column are assigned, and means for changing the order of the code word symbols in any of the columns of the matrix such that the predefined level of error correction is sufficient to correct error or loss caused to any of the symbols given a predefined level of cross-modem error burst while preserving the predefined level of error correction sufficient to correct error or loss caused to any of the symbols given the predefined level of modem loss or malfunction.

In another aspect of the present invention the means for assigning is operative to assign such that each of the modems is assigned symbols from a plurality of code words.

In another aspect of the present invention the means for assigning is operative to assign such that the code word symbols are divided as evenly as possible among the modems.

In another aspect of the present invention the means for assigning is operative to assign where the plurality of data frames number at least X/Y, where X is the maximum number of expected errors in a code word given either of the predefined level of modem loss and the predefined level of cross-modem error burst, and Y is the maximum number of symbols that may be corrected in any given code word given the predefined level of error correction.

In another aspect of the present invention X is the maximum number of expected errors in a code word if interleaving is not employed.

In another aspect of the present invention the means for changing is operative to rotate each column in the matrix downward by $C_N$ modulo F rows, where $C_N$ is the column number of the column, F is the number of rows in the matrix, and column elements that are rotated past the bottom of the matrix are rotated to the top of the column.

In another aspect of the present invention the means for changing is operative to inversely order the columns prior to the rotating.

In another aspect of the present invention the means for changing is operative to rotate each column element in the matrix downward by $(A+B*C_N)$ modulo F rows, where F is the number of rows in the matrix, A is a predetermined integer, B is a predetermined integer which is coprime to F, $C_N$ is the column number of the column, and column elements that are rotated past the bottom of the matrix are rotated to the top of the column.

In another aspect of the present invention the means for changing is operative to rotate such that a column element in the column $C_N$ and row R is moved to row $(R+A+B*C_N)$ modulo F.

In another aspect of the present invention the apparatus further includes means for deriving a modem assignment vector for each of the data frames corresponding to the assignment of the code word symbols to the modems in any of the rows, and means for transmitting via the plurality of modems in the modem pool the code word symbols corresponding to the modem assignment vector in each of the rows.

The disclosures of all patents, patent applications, and other publications mentioned in this specification and of the patents, patent applications, and other publications cited therein are hereby incorporated by reference in their entirety.

BRIEF DESCRIPTION OF THE DRAWINGS

The present invention will be understood and appreciated more fully from the following detailed description taken in conjunction with the appended drawings in which:

FIGS. 3A–3L are tabular illustrations useful in understanding the method of FIG. 2;

FIGS. 4A and 4B are tabular illustrations useful in understanding the present invention.

DETAILED DESCRIPTION OF PREFERRED EMBODIMENTS

Figure 1:
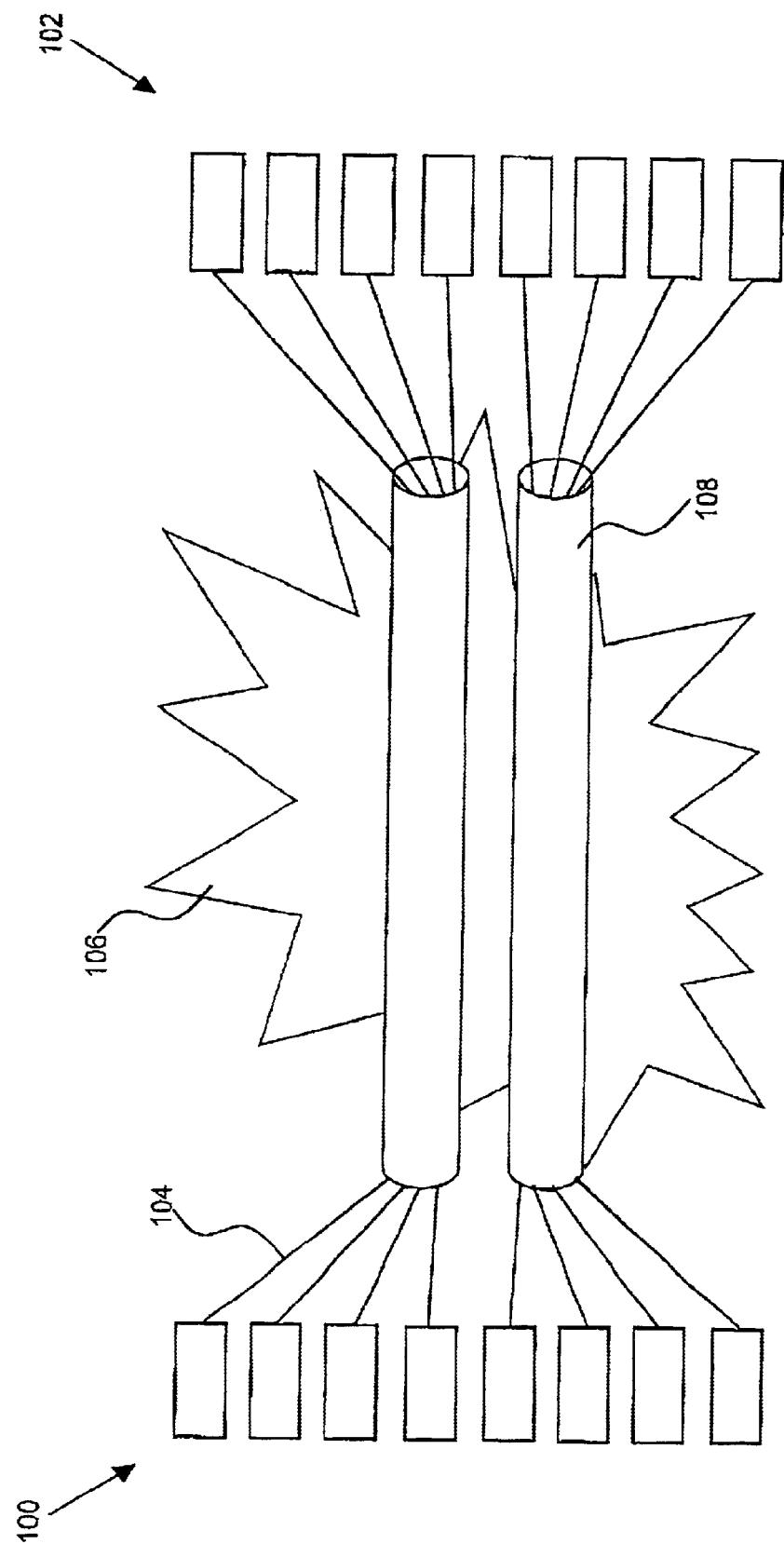
FIG. 1 is a conceptual illustration of an exemplary modem pool arrangement useful in understanding the present invention.

Reference is now made to FIG. 1, which is a conceptual illustration of an exemplary modem pool arrangement used in understanding the present invention. A first modem pool, generally referenced 100, and comprising a plurality of individual modems is seen in communication with a second modem pool, generally referenced 102, via a plurality of connections 104 over a telephone network 106. Connections 104 are typically copper wire pairs arranged in one or more bundles 108. The modem pools preferably operate in a coordinated manner where a data stream is split up and transmitted via multiple modems in one of the modem pools to the other modem pool where the original data stream is reconstructed. One example of such a modem pool system is described in Applicant/assignee's U.S. patent application Ser. No. 09/510,550 filed Feb. 22, 2000, and entitled "High Speed Access System Over Copper Cable Plant," that claims priority from U.S. Provisional Application Ser. No. 60/121, 228, filed Feb. 23, 1999, and entitled "Access Express-Very High Data Rate Communication Channels Over Copper," both hereby incorporated by reference in their entirety.

Figure 2:
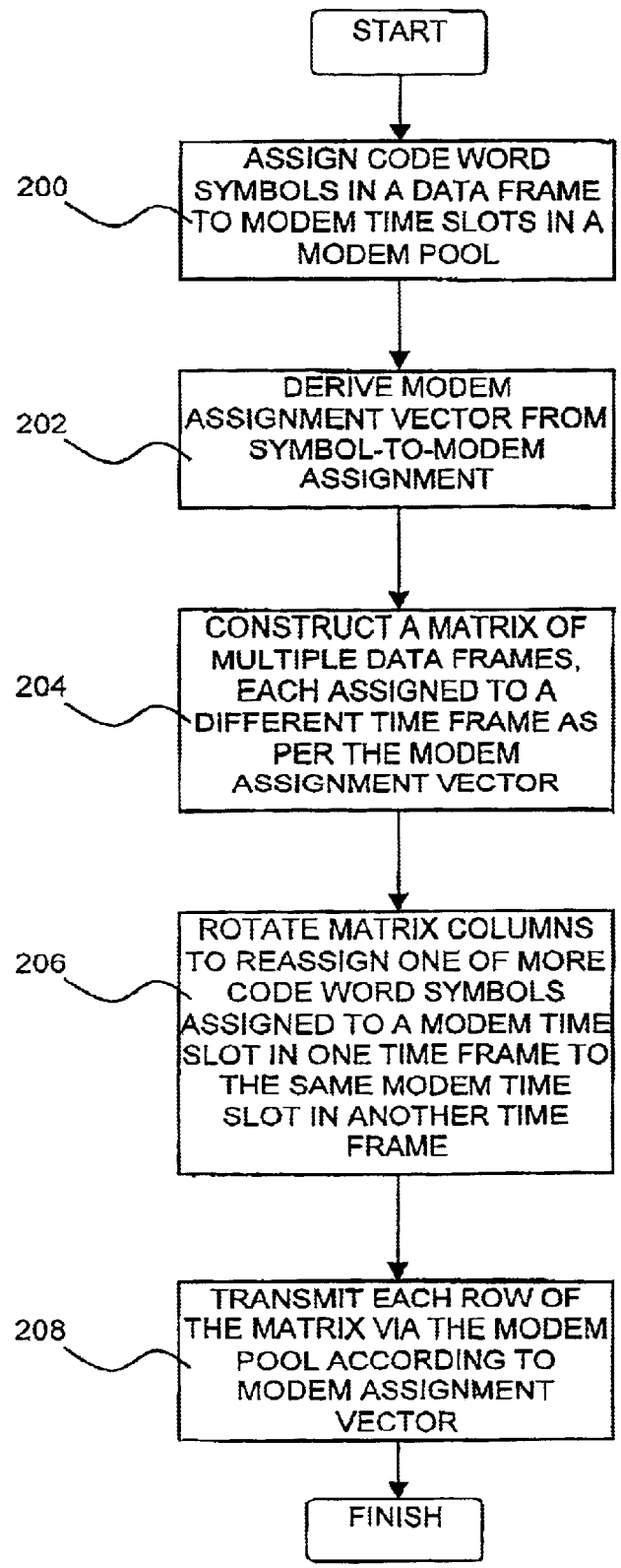
FIG. 2 is a flowchart illustration of a method for two-dimensional interleaving in a modem pool environment, operative in accordance with a preferred embodiment of the present invention.
Figure 3A:
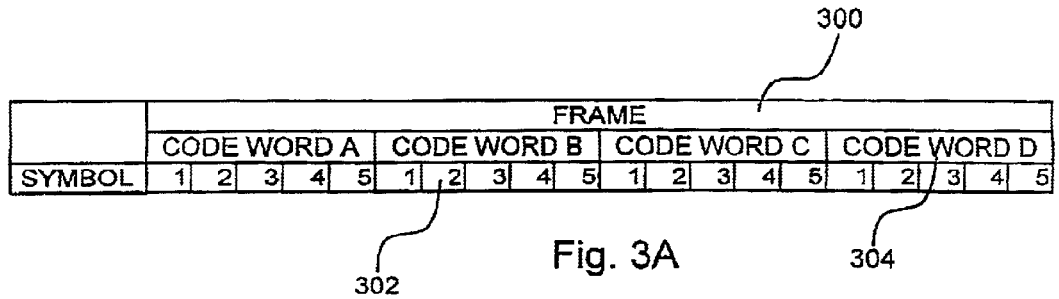
Figure 3B:
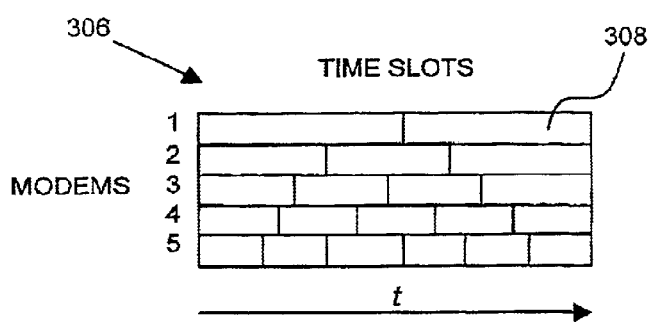

Reference is now made to FIG. 2, which is a flowchart illustration of a method for two-dimensional interleaving in a modem pool environment, operative in accordance with a preferred embodiment of the present invention, and additionally to FIGS. 3A–3I, which are tabular illustrations useful in understanding the method of FIG. 2. In the method of FIG. 2 each code word symbol in a data frame is assigned to a modem and time slot in a modem pool for transmission (step 200). An exemplary data frame 300 is seen in FIG. 3A, having four code words 304 labeled A–D. Each code word 304 includes five symbols 302 numbered 1–5. An exemplary modem time slot arrangement is seen in FIG. 3B, with a modem pool 306 having five modems labeled 1–5. Each modem is divided into one or more time slots 308 representing the number of code word symbols a modem may transmit in a single time frame, shown as an arrow labeled t. Thus, in FIG. 3B, modem 1 can transmit two symbols during time frame t and therefore has two time slots, while modem 5 can transmit six symbols during time frame t and therefore has six time slots.

Figure 3C:
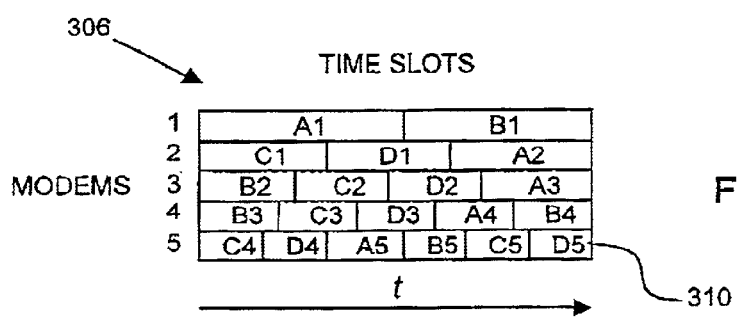

In FIG. 3C the code word symbols of frame 300 of FIG. 3A are shown, having been assigned to the time slots of modem pool 306 in both modem order and in code word round-robin fashion. Thus, symbol 1 of code word A of frame 300, denoted A1, is assigned to the first time slot of modem 1, and symbol 1 of code word B, denoted B1, is assigned to the second time slot of modem 1. With the time slots of modem 1 having been fully populated with code word symbols, symbol 1 of code word C, denoted C1, is assigned to the first time slot of modem 2, and symbol 1 of code word D, denoted D1, is assigned to the second time slot of modem 2. With one symbol from each code word of frame 300 having been allocated to modem time slots, symbol-to-modem assignment then continues with symbol 2 of code word A, denoted A2, being assigned to the third time slot of modem 3, and so on, until all code word symbols have been distributed to modem time slots, ending with symbol 5 of code word D, denoted D5, being assigned to the sixth time slot of modem 5, shown at reference numeral 310.

It may be seen in FIG. 3C that the round-robin symbol-to-modem assignment described hereinabove achieves code word heterogeneity within a given modem such that each modem is assigned symbols from the greatest possible number of code words. Thus, modem 5, having six time slots, includes one symbol from each of code words A and B of frame 300 and two symbols from each of code words C and D. Such an assignment may provide maximum protection against the loss or malfunction of any given modem, and thus the loss of some or all of the code word symbols that would have been transmitted by the modem. Thus, were frame 300 to include error correction sufficient to recover up to two lost symbols from each of code words A–D, the loss or malfunction of any single modem in modem pool 306, and in some cases two modems, would still allow the recovery of the symbols assigned to the modem.

The round-robin symbol-to-modem assignment shown in FIG. 3C may be expressed as a modem assignment vector 314 (step 202), such as is shown in FIG. 3E, where the modem to which each code word symbol is assigned in FIG. 3C appears below each code word symbol. Thus, modem 1 appears below code word A1 as shown at reference numeral 316, while modem 2 appears below code word D1 as shown at reference numeral 318.

Figure 3D:
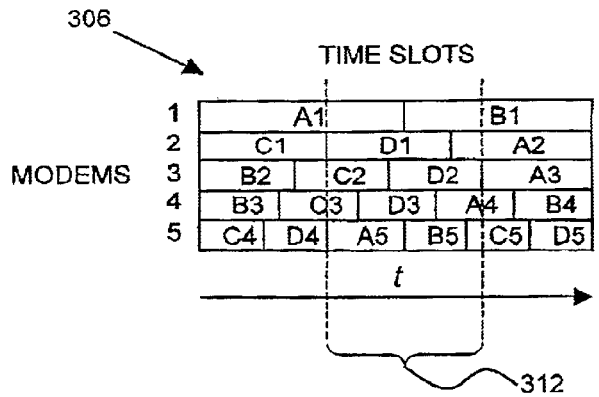

While the round-robin symbol-to-modem assignment described hereinabove may maximize protection against modem loss or malfunction, FIG. 3D shows the effect of an error burst that causes errors across multiple modems of modem pool 306 during an interval 312 of time frame t. During error burst interval 312, code word symbols D1, D2, and D3 are all affected. In the current example, were frame 300 to include error correction sufficient to recover up to two lost symbols from each of code words A–D, such an error burst would not allow the recovery of symbols in code words where three or more symbols are lost or contain errors.

Figure 4A:
Figure 4B:
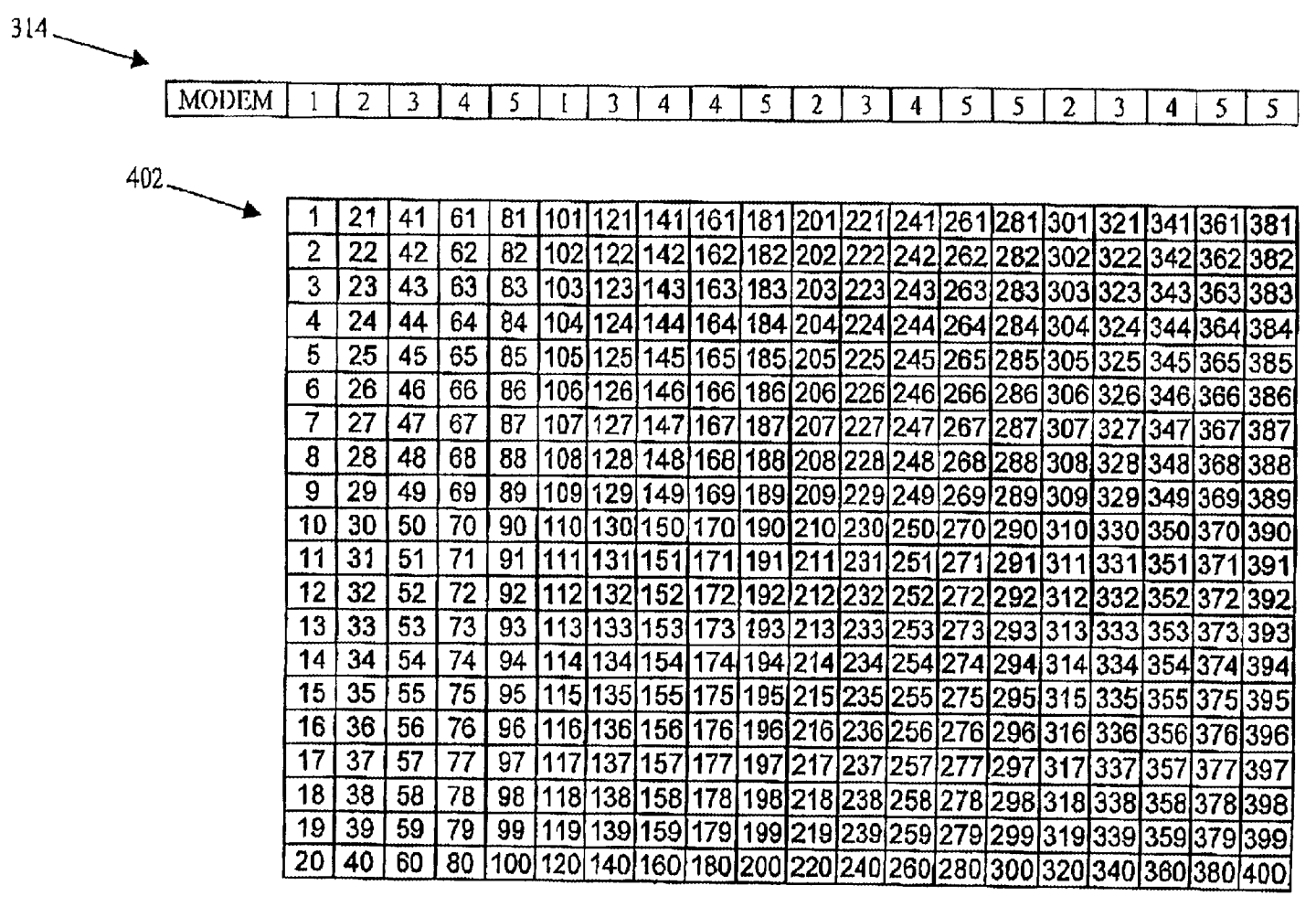

Although standard interleaving techniques may be used at this point to provide protection against such cross-modem error bursts, doing so is likely to come at the expense of losing protection against modem loss or malfunction. This may be understood with reference to FIG. 4A in which a matrix 400 is constructed having a number of rows corresponding to the assignment of multiple data frames to the modems in the modem pool during multiple time frames. In the example shown, matrix 400 is constructed from an arbitrary 20 data frames. In matrix 400 a unique index is assigned to distinguish between each code word-frame-modem combination. Thus, code word A1 of frame 1 is assigned index 1, code word D5 of frame 1 is assigned index 20, code word A1 of frame 2 is assigned index 21, and so on until code word D5 of frame 20 is assigned index 400. Applying standard interleaving techniques, matrix 400 is read column-wise and rearranged row-wise as shown in FIG. 4B. It may be seen that FIG. 4B having a matrix 402 provides protection against error bursts, since, for example, index elements 1, 2, 3, 4, and 5 of FIG. 4B, corresponding to code word A1 of frame 1 of FIG. 4A, are transmitted over multiple time frames. However, by transmitting each row according to modem assignment vector 314 (FIG. 3E) in order to maintain protection against errors due to modem loss or malfunction, it may be seen that index elements 1, 2, 3, 4, and 5 are all transmitted via modem 1. Thus, were modem 1 to fail, the entire code word A1 of frame 1 would be lost.

Thus, in order to provide protection against both modem loss or malfunction and cross-modem error bursts, the method of FIG. 2 therefore continues with the construction of a matrix 320, as is shown in FIG. 3F, having a number of rows corresponding to the assignment of multiple data frames to the modems in the modem pool during multiple time frames, with each row having the same modem assignment vector 314 applied to a different data frame (step 204). It may be seen in FIG. 3F that each code word symbol is assigned to the same modem in each frame. Preferably, the number of rows/frames in matrix 320 should be at least X/Y, where X is a maximum number of expected errors in a code word if interleaving is not employed, given a predefined level of modem loss or malfunction and/or a predefined error burst, and Y is the error correction capability available for each code word. For example, if protection against the loss of one modem and/or an error burst of 20 ms is desired, and, given a particular number of modems, number of time slots, and time frame duration, such a modem loss/error burst could be expected to result in a maximum of 5 symbol errors in any given code word (X), and if the error correction capability available for each code word is 1 symbol (Y), then X/Y=5, and, therefore, at least five data frames would be required, such as is shown in FIG. 3F.

To better distinguish between the code word symbols of the different frames represented by the various modem assignment vectors in matrix 320, and for the purpose of better illustrating the present invention, a matrix 322, as is shown in FIG. 3G, may be constructed by assigning a unique index to each code word-frame-modem combination. Thus, in FIG. 3G, code word A1 of frame 1 is assigned index 1, code word D5 of frame 1 is assigned index 20, code word A1 of frame 2 is assigned index 21, and so on until code word D5 of frame 5 is assigned index 100.

In order to provide protection against both modem loss or malfunction and cross-modem error bursts, one of more code word symbols assigned to a modem time slot in one time frame may be reassigned to the same modem time slot in another time frame, thus assigning the code word symbols from each code word to two or more frames and to two or more modems, preferably such that the code word symbols are divided as evenly as possible among the frames, and also divided as evenly as possible among the modems. Thus, the method of FIG. 2 continues with one or more columns of matrix 322 being rearranged (step 206), such as is shown in FIG. 3H where each column in matrix 322 is rotated downward by $C_N$ modulo F rows, resulting in a matrix 322', where $C_N$ is the column number, shown at reference numeral 324, and F is the number of rows/frames. (Column elements that "fall off" the bottom of the matrix are rotated to the top of the column.). Alternatively, as is shown in FIG. 3I, the columns may be inversely ordered before being rotated downward by $C_N$ modulo F rows, resulting in a matrix 322".

Alternatively, as is shown in FIG. 3J, each column in matrix 322 may be rotated downward by $(A+B*C_N)$ modulo F rows, where A is any integer, B is an integer that is coprime to F, $C_N$ is the column number, and F is the number of rows/frames. Each column element in column $C_N$ and row R is thus moved to row $(R+A+B*C_N)$ modulo F. In the example shown in FIG. 3J, A=1and B=2(being coprime to 5), resulting in a matrix 322'''.

Once the order within the columns of FIG. 3G has been changed as described above, each row, representing a newly reconstituted frame, may be transmitted via modem pool 306 according to modem assignment vector 314 (step 208). Thus, in FIG. 3I, the first row is transmitted as shown in FIG. 3K.

Figures 3K, 3L:
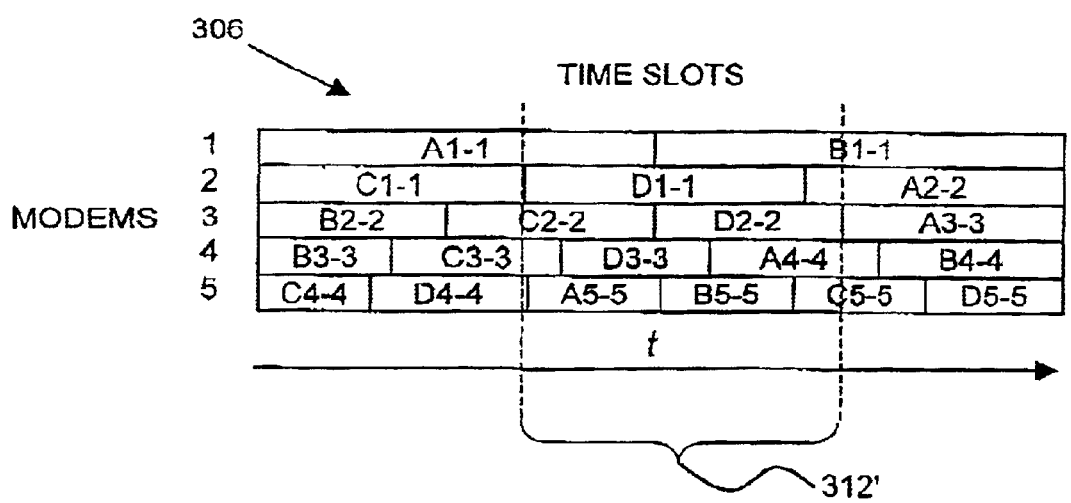

The net effect of the method of FIG. 2 may be seen by comparing FIGS. 3C and 3D with FIG. 3L. With regard to modem loss or malfunction, both FIGS. 3C and 3L provide the same optimal amount of protection. With regard to error bursts, in FIG. 3D during error burst interval 312, code word symbols D1, D2, and D3 all belong to the same code word and the same frame, and are all affected. Thus, error correction sufficient to recover up to three lost symbols per code word per frame would be required to recover code word symbols D1, D2, and D3. In contrast, in FIG. 3L during error burst interval 312', code word symbols D1, D2, and D3 are likewise affected. However, code word symbol D1 belongs to frame 1 (as denoted by D1-1), code word symbol D2 belongs to frame 2 (as denoted by D2-2), and code word symbol D3 belongs to frame 3 (as denoted by D3-3). Thus, error correction sufficient to recover only one symbol per code word per frame is required to recover code word symbols D1-1, D2-2, and D3-3. Thus, in contrast with conventional interleaving techniques, the present invention provides protection against both modem loss or malfunction and cross-modem error bursts.

Figure 5:
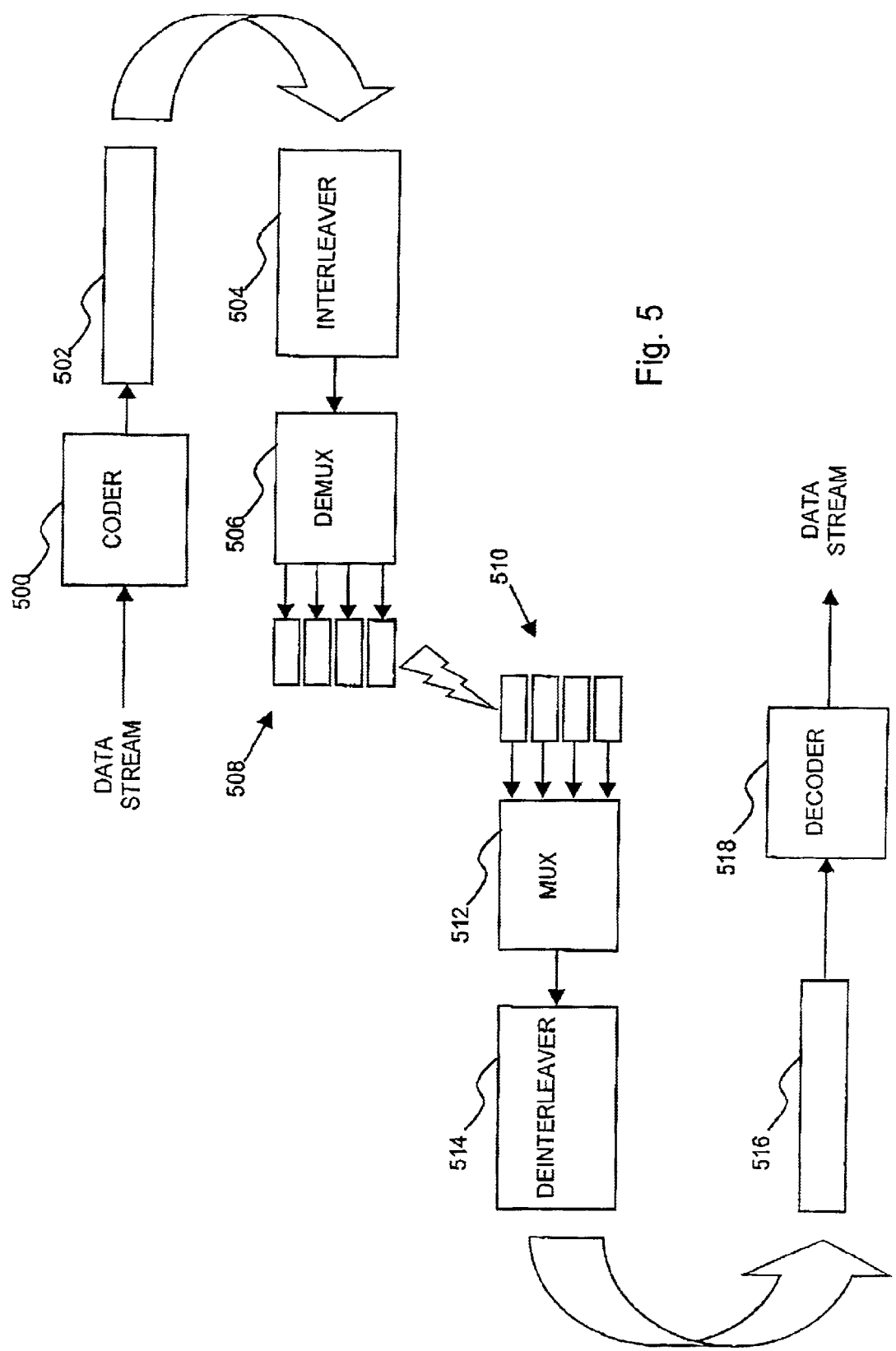
FIG. 5 is a simplified block-flow diagram of a modem pool communications system, constructed and operative in accordance with a preferred embodiment of the present invention.

Reference is now made to FIG. 5 which is a simplified block-flow diagram of a modem pool communications system, constructed and operative in accordance with a preferred embodiment of the present invention. In the system of FIG. 5 a data stream is encoded at a coder 500, typically a Reed-Solomon coder, into one or more code words 502 typically comprising a data portion and a redundancy portion that preferably comprises sufficient redundancy to allow correction of a predetermined number of errors. Code words 502 are then preferably interleaved in accordance with any of the methods described hereinabove at an interleaver 504 and demultiplexed at a demultiplexor 506 for parallel transmission via one or more modems in a modem pool 508, where each modem preferably transmits a different portion of each code word in accordance with any of the methods described hereinabove.

At the receiving end the demultiplexed code word portions are received by modems in a modem pool 510, multiplexed back into interleaved code words at a multiplexer 512, and deinterleaved at a deinterleaver 514 into code words 516 corresponding to code words 502. Code words 516 are then preferably fed into a decoder 518 which detects and corrects any errors in code words 516 in accordance with conventional techniques.

It is appreciated that one or more of the steps of any of the methods described herein may be omitted or carried out in a different order than that shown, without departing from the true spirit and scope of the invention.

While the present invention has been described with reference to one or more specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

What is claimed is:

1. A method for interleaving a plurality of data frames for transmission via a plurality of modems in a modem pool, where each of said data frames includes a plurality of code words having a predefined level of error corrections the method comprising:

assigning said plurality of data frames to a corresponding plurality of modem time frames, wherein a plurality of code word symbols in each of said data frames is assigned to a plurality of time slots in said modems in said corresponding time frames such that said predefined level of error correction is sufficient to correct error or loss caused to any of said symbols given a predefined level of modem loss or malfunction; and moving any of said code word symbols assigned to one of said time frames to another of said time frames such that said predefined level of error correction is sufficient to correct error or loss caused to any of said symbols given a predefined level of cross-modem error burst while preserving said predefined level of error correction sufficient to correct error or loss caused to any of said symbols given said predefined level of modem loss or malfunction.

2. A method according to claim 1 wherein said assigning step comprises assigning such that each of said modems is assigned symbols from a plurality of code words.

3. A method according to claim 1 wherein said assigning step comprises assigning such that said code word symbols are divided as evenly as possible among said modems.

4. A method according to claim 1 wherein said assigning step comprises assigning where said plurality of data frames number at least X/Y, wherein X is the maximum number of expected errors in a code word given either of said predefined level of modem loss and said predefined level of cross-modem error burst, and Y is the maximum number of symbols that may be corrected in any given code word given said predefined level of error correction.

5. A method according to claim 4 wherein X is the maximum number of expected errors in a code word if interleaving is not employed.

6. A method according to claim 1 wherein said moving step comprises moving any of said code word symbols assigned to a modem time slot in one of said time frames to the same modem time slot in another of said time frames.

7. A method according to claim 1 wherein said moving step comprises moving such that each of said time frames includes code word symbols from a plurality of said data frames.

8. A method according to claim 1 wherein said moving step comprises moving such that said code word symbols are divided as evenly as possible among said time frames.

9. A method according to claim 1 and further comprising:

deriving a modem assignment vector for each of said data frames corresponding to the assignment of said code word symbols to said modems in any of said time frames; and transmitting via said plurality of modems in said modem pool the code word symbols corresponding to the modem assignment vector in each of said time frames.

10. A method for interleaving a plurality of data frames for transmission via a plurality of modems in a modem pool, where each of said data frames includes a plurality of code words having a predefined level of error correction, the method comprising:

assigning said plurality of data frames to a corresponding plurality of modem time frames, wherein a plurality of code word symbols in each of said data frames is assigned to a plurality of time slots in said modems in said corresponding time frames such that said predefined level of error correction is sufficient to correct error or loss caused to any of said symbols given a predefined level of modem loss or malfunction;

constructing a matrix having a plurality of rows and columns, each row comprising a different one of said data frames and each column corresponding to one of said modems via which said code word symbols in said column are assigned; and changing the order of the code word symbols in any of the columns of said matrix such that said predefined level of error correction is sufficient to correct error or loss caused to any of said symbols given a predefined level of cross-modem error burst while preserving said predefined level of error correction sufficient to correct error or loss caused to any of said symbols given said predefined level of modem loss or malfunction.

11. A method according to claim 10 wherein said assigning step comprises assigning such that each of said modems is assigned symbols from a plurality of code words.

12. A method according to claim 10 wherein said assigning step comprises assigning such that said code word symbols are divided as evenly as possible among said modems.

13. A method according to claim 10 wherein said assigning step comprises assigning where said plurality of data frames number at least X/Y, wherein X is the maximum number of expected errors in a code word given either of said predefined level of modem loss and said predefined level of cross-modem error burst, and Y is the maximum number of symbols that may be corrected in any given code word given said predefined level of error correction.

14. A method according to claim 13 wherein X is the maximum number of expected errors in a code word if interleaving is not employed.

15. A method according to claim 10 wherein said changing step comprises rotating each column in said matrix downward by $C_N$ modulo F rows, wherein $C_N$ is the column number of said column, F is the number of rows in said matrix, and column elements that are rotated past the bottom of said matrix are rotated to the top of said column.

16. A method according to claim 15 wherein said changing step comprises inversely ordering said columns prior to said rotating.

17. A method according to claim 10 wherein said changing step comprises rotating each column element in said matrix downward by $(A+B*C_N)$ modulo F rows, wherein F is the number of rows in said matrix, A is a predetermined integer, B is a predetermined integer which is coprime to F, $C_N$ is the column number of said column, and column elements that are rotated past the bottom of said matrix are rotated to the top of said column.

18. A method according to claim 17 wherein said changing step comprises rotating such that a column element in said column $C_N$ and row R is moved to row $(R+A+B*C_N)$ modulo F.

19. A method according to claim 10 and further comprising:
deriving a modem assignment vector for each of said data frames corresponding to the assignment of said code word symbols to said modems in any of said rows; and
transmitting via said plurality of modems in said modem pool the code word symbols corresponding to the modem assignment vector in each of said rows.

20. A system for interleaving a plurality of data frames for transmission via a plurality of modems in a modem pool, where each of said data frames includes a plurality of code words having a predefined level of error correction, the system comprising:
a coder operative to encode a data stream into said plurality of code words; and
an interleaver operative to:
assign said plurality of data frames to a corresponding plurality of modem time frames, wherein a plurality of code word symbols in each of said data frames is assigned to a plurality of time slots in said modems in said corresponding time frames such that said predefined level of error correction is sufficient to correct error or loss caused to any of said symbols given a predefined level of modem loss or malfunction; and
move any of said code word symbols assigned to one of said time frames to another of said time frames such that said predefined level of error correction is sufficient to correct error or loss caused to any of said symbols given a predefined level of cross-modem error burst while preserving said predefined level of error correction sufficient to correct error or loss caused to any of said symbols given said predefined level of modem loss or malfunction.

21. A system according to claim 20 wherein said interleaver is operative to assign such that each of said modems is assigned symbols from a plurality of code words.

22. A system according to claim 20 wherein said interleaver is operative to assign such that said code word symbols are divided as evenly as possible among modems.

23. A system according to claim 20 wherein said interleaver is operative to assign where said plurality of data frames number at least X/Y, wherein X is the maximum number of expected errors in a code word given either of said predefined level of modem loss and said predefined level of cross-modem error burst, and Y is the maximum number of symbols that may be corrected in any given code word given said predefined level of error correction.

24. A system according to claim 23 wherein X is the maximum number of expected errors in a code word if interleaving is not employed.

25. A system according to claim 20 wherein said interleaver is operative to move any of said code word symbols assigned to a modem time slot in one of said time frames to the same modem time slot in another of said time frames.

26. A system according to claim 20 wherein said interleaver is operative to move such that each of said time frames includes code word symbols from a plurality of said data frames.

27. A system according to claim 20 wherein said interleaver is operative to move such that said code word symbols are divided as evenly as possible among said time frames.

28. A system according to claim 20 and further comprising a demultiplexor operative to:
derive a modem assignment vector for each of said data frames corresponding to the assignment of said code word symbols to said modems in any of said time frames; and
transmit via said plurality of modems in said modem pool the code word symbols corresponding to the modem assignment vector in each of said time frames.

29. A system for interleaving a plurality of data frames for transmission via a plurality of modems in a modem pool, where each of said data frames includes a plurality of code words having a predefined level of error correction, the system comprising:
a coder operative to encode a data stream into said plurality of code words; and
an interleaver operative to:
assign said plurality of data frames to a corresponding plurality of modem time frames, wherein a plurality of code word symbols in each of said data frames is assigned to a plurality of time slots in said modems in said corresponding time frames such that said predefined level of error correction is sufficient to correct error or loss caused to any of said symbols given a predefined level of modem loss or malfunction;
construct a matrix having a plurality of rows and columns, each row comprising a different one of said data frames and each column corresponding to one of said modems via which said code word symbols in said column are assigned; and
change the order of the code word symbols in any of the columns of said matrix such that said predefined level of error correction is sufficient to correct error or loss caused to any of said symbols given a predefined level of cross-modem error burst while preserving said predefined level of error correction sufficient to correct error or loss caused to any of said symbols given said predefined level of modem loss or malfunction.

30. A system according to claim 29 wherein said interleaver is operative to assign such that each of said modems is assigned symbols from a plurality of code words.

31. A system according to claim 29 wherein said interleaver is operative to assign such that said code word symbols are divided as evenly as possible among said modems.

32. A system according to claim 29 wherein said interleaver is operative to assign where said plurality of data frames number at least X/Y, wherein X is the maximum number of expected errors in a code word given either of said predefined level of modem loss and said predefined level of cross-modem error burst, and Y is the maximum number of symbols that may be corrected in any given code word given said predefined level of error correction.

33. A system according to claim 32 wherein X is the maximum number of expected errors in a code word if interleaving is not employed.

34. A system according to claim 29 wherein said interleaver is operative to rotate each column in said matrix downward by $C_N$ modulo F rows, wherein $C_N$ is the column number of said column, F is the number of rows in said matrix, and column elements that are rotated past the bottom of said matrix are rotated to the top of said column.

35. A system according to claim 34 wherein said interleaver is operative to inversely order said columns prior to said rotating.

36. A system according to claim 29 wherein said interleaver is operative to rotate each column element in said matrix downward by $(A+B*C_N)$ modulo F rows, wherein P is the number of rows in said matrix, A is a predetermined integer, B is a predetermined integer which is coprime to F, $C_N$ is the column number of said column, and column elements that are rotated past the bottom of said matrix are rotated to the top of said column.

37. A system according to claim 36 wherein said interleaver is operative to rotate such that a column element in said column $C_N$ and row R is moved to row $(R+A+B*C_N)$ modulo F.

38. A system according to claim 29 and further comprising a demultiplexor operative to:
  derive a modem assignment vector for each of said data frames corresponding to the assignment of said code word symbols to said modems in any of said rows; and
  transmit via said plurality of modems in said modem pool the code word symbols corresponding to the modem assignment vector in each of said rows.

39. In a system comprising a plurality of data frames for transmission via a plurality of modems in a modem pool, where each of said data frames includes a plurality of code words having a predefined level of error correction, interleaving apparatus comprising:
  means for assigning said plurality of data frames to a corresponding plurality of modem time frames, wherein a plurality of code word symbols in each of said data frames is assigned to a plurality of time slots in said modems in said corresponding time frames such that said predefined level of error correction is sufficient to correct error or loss caused to any of said symbols given a predefined level of modem loss or malfunction; and
  means for moving any of said code word symbols assigned to one of said time frames to another of said time frames such that said predefined level of error correction is sufficient to correct error or loss caused to any of said symbols given a predefined level of cross-modem error burst while preserving said predefined level of error correction sufficient to correct error or loss caused to any of said symbols given said predefined level of modem loss or malfunction.

40. Apparatus according to claim 39 wherein said means for assigning is operative to assign such that each of said modems is assigned symbols from a plurality of code words.

41. Apparatus according to claim 39 wherein said means for assigning is operative to assign such that said code word symbols are divided as evenly as possible among said modems.

42. Apparatus according to claim 39 wherein said means for assigning is operative to assign where said plurality of data frames number at least X/Y, wherein X is the maximum number of expected errors in a code word given either of said predefined level of modem loss and said predefined level of cross-modem error burst, and Y is the maximum number of symbols that may be corrected in any given code word given said predefined level of error correction.

43. Apparatus according to claim 42 wherein X is the maximum number of expected errors in a code word if interleaving is not employed.

44. Apparatus according to claim 39 wherein said means for moving is operative to move any of said code word symbols assigned to a modem time slot in one of said time frames to the same modem time slot in another of said time frames.

45. Apparatus according to claim 39 wherein said means for moving is operative to move such that each of said time frames includes code word symbols from a plurality of said data frames.

46. Apparatus according to claim 39 wherein said means for moving is operative to move such that said code word symbols are divided as evenly as possible among said time frames.

47. Apparatus according to claim 39 and further comprising:
  means for deriving a modem assignment vector for each of said data frames corresponding to the assignment of said code word symbols to said modems in any of said time frames; and
  means for transmitting via said plurality of modems in said modem pool the code word symbols corresponding to the modem assignment vector in each of said time frames.

48. In a system comprising a plurality of data frames for transmission via a plurality of modems in a modem pool, where each of said data frames includes a plurality of code words having a predefined level of error correction, interleaving apparatus comprising:
  means for assigning said plurality of data frames to a corresponding plurality of modem time frames, wherein a plurality of code word symbols in each of said data frames is assigned to a plurality of time slots in said modems in said corresponding time frames such that said predefined level of error correction is sufficient to correct error or loss caused to any of said symbols given a predefined level of modem loss or malfunction;
  means for constructing a matrix having a plurality of rows and columns, each row comprising a different one of said data frames and each column corresponding to one of said modems via which said code word symbols in said column are assigned; and means for changing the order of the code word symbols in any of the columns of said matrix such that said predefined level of error correction is sufficient to correct error or loss caused to any of said symbols given a predefined level of cross-modem error burst while preserving said predefined level of error correction sufficient to correct error or loss caused to any of said symbols given said predefined level of modem loss or malfunction.

49. Apparatus according to claim 48 wherein said means for assigning is operative to assign such that each of said modems is assigned symbols from a plurality of code words.

50. Apparatus according to claim 48 wherein said means for assigning is operative to assign such that said code word symbols are divided as evenly as possible among said modems.

51. Apparatus according to claim 48 wherein said means for assigning is operative to assign where said plurality of data frames number at least X/Y, wherein X is the maximum number of expected errors in a code word given either of said predefined level of modem loss and said predefined level of cross-modem error burst, and Y is the maximum number of symbols that may be corrected in any given code word given said predefined level of error correction.

52. Apparatus according to claim 51 wherein X is the maximum number of expected errors in a code word if interleaving is not employed.

53. Apparatus according to claim 48 wherein said means for changing is operative to rotate each column in said matrix downward by $C_N$ modulo F rows, wherein $C_N$ is the column number of said column, F is the number of rows in said matrix, and column elements that are rotated past the bottom of said matrix are rotated to the top of said column.

54. Apparatus according to claim 53 wherein said means for changing is operative to inversely order said columns prior to said rotating.

55. Apparatus according to claim 48 wherein said means for changing is operative to rotate each column element in said matrix downward by $(A+B*C_N)$ modulo F rows, wherein F is the number of rows in said matrix, A is a predetermined integer, B is a predetermined integer which is coprime to F, $C_N$ is the column number of said column, and column elements that are rotated past the bottom of said matrix are rotated to the top of said column.

56. Apparatus according to claim 55 wherein said means for changing is operative to rotate such that a column element in said column $C_N$ and row R is moved to row $(R+A+B*C_N)$ modulo F.

57. Apparatus according to claim 48 and further comprising:

means for deriving a modem assignment vector for each of said data frames corresponding to the assignment of said code word symbols to said modems in any of said rows; and means for transmitting via said plurality of modems in said modem pool the code word symbols corresponding to the modem assignment vector in each of said rows.

* * * * *